US005673326A

United States Patent [19]

Goldfarb

[11] Patent Number: 5,673,326

[45] Date of Patent: Sep. 30, 1997

[54] AUDIO BASS SPEAKER DRIVER CIRCUIT

[75] Inventor: Barry S. Goldfarb, Deland, Fla.

[73] Assignee: BSG Laboratories, Deland, Fla.

[21] Appl. No.: 410,677

[22] Filed: Mar. 27, 1995

Related U.S. Application Data

[63] Continuation-in-part of Ser. No. 875,399, Apr. 29, 1992, abandoned.

[51] Int. Cl.[6] .......... H03G 5/00

[52] U.S. Cl. .......... 381/99; 381/28

[58] Field of Search .......... 381/99, 98, 101, 381/103, 120, 111, 116, 117, 28, 61; 333/28 T; 327/551, 552; 330/126, 306

[56] References Cited

U.S. PATENT DOCUMENTS

| | | | |
|---|---|---|---|
| 3,657,480 | 4/1972 | Cheng et al. . | |
| 4,118,600 | 10/1978 | Stahl . | |
| 4,137,510 | 1/1979 | Iwahara | 381/100 |
| 4,475,233 | 10/1984 | Watkins . | |
| 4,495,638 | 1/1985 | Yamada et al. . | |
| 5,200,709 | 4/1993 | Saito et al. | 330/126 |
| 5,357,208 | 10/1994 | Nelson | 330/306 |

*Primary Examiner*—Curtis Kuntz
*Assistant Examiner*—Ping W. Lee
*Attorney, Agent, or Firm*—Quarles & Brady

[57] ABSTRACT

A bass audio circuit includes a first filter network which receives left and right channel input signals and produces two filtered signals by attenuating frequencies in the input signals above a first cutoff frequency. The two filtered signals are summed to create a first monophonic signal. A second filter network produces attenuated frequencies in either the input signals or in the first monophonic signal that are above a second cutoff frequency which is lower than the first cutoff frequency. The signals from the second filter network are combined and passed through a phase inverter to derive a second monophonic signal. An output stage individually amplifies the two monophonic signals which then either are applied to a dual voice coil woofer, or are electrically summed and applied to a single voice coil woofer. Alternatively, the two monophonic signals are first summed and applied to a single channel amplifier which drives a single voice coil woofer. This audio circuit adjusts the relative emphasis of psychoacoustic elements of the bass signals to accurately emulate the bass performance of the sound being projected and enhances performance of a woofer driver by limiting extremely low frequency displacement.

24 Claims, 4 Drawing Sheets

Output Frequency Response of the First Filter Network (Dashed) and Second Filter Network (Solid) in dB Output Frequency Response of the Output of the Second Filter Network Signal in dB Frequency Response of the Total Speaker Input in dB with a Second Filter Network Gain of 1.4

Frequency Response of the Total Speaker Input in dB with a Second Filter Network Gain of 1.0

AUDIO BASS SPEAKER DRIVER CIRCUIT

CROSS-REFERENCE TO RELATED APPLICATION

This is a continuation-in-part of U.S. patent application No. 07/875,399, filed Apr. 29, 1992, now abandoned.

BACKGROUND OF THE INVENTION

1. Technical Field of the Invention

The invention relates to a frequency filter system for sound systems; and more particularly, to a frequency filter for audio signals in the bass region.

2. Discussion of Related Art

In the past, a wide variety of techniques have been employed to improve the bass response in hi-fidelity and stereo audio systems. Typically, these systems provide a speaker having a large diaphragm and a longer throw to the diaphragm for moving the larger amount of air required to gain the intensity required for low frequencies. Focus has been placed on maximizing intensity and "punch." Other psychoacoustic elements of the audio experience in the bass region, such as the inaudible infrasonic frequencies that are felt by the observer, have been considered.

However, little attention has been paid to directionality and spatiality which can be attributed to the understanding that direction and sound source location generally are not perceptible to humans for sound waves below approximately 150 Hz. This results from low frequencies having relatively long wavelengths, for example a 130 Hz signals has a wavelength of 8.7 feet, thus bass frequencies tend not to be directional. Higher frequency sound in the range of 150 Hz to 550 Hz becomes more spatially and directionally perceptible, but such range has not traditionally been directed to bass speakers and their enclosures. As a result, it has been common to apply both channels of a stereo system to a single lower bass speaker, called a woofer or subwoofer. This configuration is sometimes referred to as "summing to mono."

The bass performance of a speaker system typically depends heavily upon the design of its enclosure and different types of enclosures have been designed for better speaker performance in delivering intensity and punch. Representative developments directed toward increasing bass range response and performance include the basic infinite baffle enclosure which provides a bass driver mounted to a baffle in a very large enclosure in a manner that keeps the front wave isolated from the back wave of the driver's moving diaphragm. Another development is an acoustic suspension speaker that uses a smaller infinite baffle enclosure with a loosely suspended diaphragm having a very flexible surround. Thus, the rarefaction and compression of air inside the enclosure in accordance with the in and out movement of the diaphragm tends to control the movement of the diaphragm. Thus the speaker is said to be an air suspension type, rather than having the surround of the diaphragm control the stiffness as it moves further away from the null position. A bass reflex enclosure, which is sometimes called a vented or ported enclosure, on the other hand, attempts to use the back wave energy indirectly by creating a port from the enclosure which is tuned (or sized) to create a resonance from the enclosure. This cabinet resonance is tuned to below the resonance of the speaker to provide a deeper bass response by the utilization of the back wave of the speaker.

Other designs for handling or improving the bass response include an acoustic transmission line speaker which merely forms a long path from the rear of the woofer to reduce the level of sound from the rear of the speaker and to produce a resonance in tune with the output of the speaker. The horn-loaded speaker employs a large horn connected directly in front of the speaker to improve the efficiency of the speaker. The horn improves the coupling of the speaker to the surrounding air. An electronically equalized bass speaker boosts the level of the bass signal going into the amplifier and into the speaker to make up for a predictable bass roll off that a small speaker will suffer. However, the design has the drawback of placing a greater strain on the amplifier and for this reason separate bass amplifiers sometimes are incorporated into the system.

The desire for louder more powerful and deeper bass has resulted in specially designed amplifiers to improve low frequency output of the speaker systems. These include using an improved high power amplifier with attention paid to the power supply and improved damping factors, i.e. the ability for an amplifier to control a loudspeaker motion. Another technique has been to utilize a servo feedback where a sensor is attached to the transducer and senses when a driver is being over driven to feed back that information to the amplifier. The amplifier then momentarily reverses signal phase to correct the driver. Another approach is an isobaric configuration which uses more exotic enclosures and more transducers.

A better understanding of the limitations of present configurations can be achieved after reviewing the characteristics of a simplified speaker system. For the purpose of this discussion, a low frequency acoustic driver can be modeled as a piston source. From page 59 of a text by Frank Fahy entitled Sound and Structural Vibration, the far field pressure can be expressed as:

$$p(r,t) = -j\rho_0 cka^2 v_n e^{j\omega t}\left[\frac{2J_1(ka\sin(\theta))}{ka\sin(\theta)}\right]\frac{e^{-jkr}}{2r} \qquad (1)$$

where p is the far field pressure, r is the distance from the piston source to the point in the far field for which the far field pressure ps is calculated, t is time, j is the square root of −1, $\rho_0$ is the density of air, c is the speed of sound in air, k is the acoustic wavenumber, a is the speaker piston diameter, $v_n$ is the velocity of the speaker piston $J_i$ is the first order Bessel function of the first kind and θ is the angle from the normal direction to the speaker piston surface. This equation rewritten in terms of speaker piston displacement and further reduced by observing the pressure at θ equal to zero, becomes:

$$p(r,t) = -\omega^2\rho_0 a^2 d e^{j\omega t}\left[\frac{2J_1(ka)}{ka}\right]\frac{e^{-jkr}}{2r} \qquad (2)$$

The function in brackets is approximately one for low frequencies, thus for a given piston, the pressure at a particular distance r is proportional to the square of the frequency (ω) and the displacement d of the piston. Thus, for every halving of frequency, the displacement of the speaker piston needs to increase by a factor of four to achieve a given sound pressure level (SPL). Humans are incapable of hearing the sound below some frequency between 20 and 40 Hz, although a psychoacoustic effect is present as the infrasonic acoustic wave is felt. The term "infrasound" as used herein describes the range of acoustic frequencies below the lowest audible frequency of most humans. Most audio systems allow the power amplifier to deliver the full range of frequencies below this level to be sent to the speakers.

Speakers have a finite displacement range in which their response remains linear as a function of input voltage. At input voltages above this limit, the speaker will begin to bottom-out resulting in enhancement of harmonic distortion. Thus, the ultimate limit of the speaker's displacement is controlled by the very low frequencies which are inaudible. Such criteria have been the focus of existing bass audio equipment design and performance. Additionally, the modeling of preferred sound performance on stereo arrangements of sound sources, placed to the left and right in front of the listener, has further de-emphasized concern for the directionality or spatiality of low frequency bass signals.

SUMMARY OF THE INVENTION

It is an object of the present invention to provide a bass audio system that accommodates elements of intensity, spatiality, directionality and reverberation in the bass audio region to provide a realistic psychoacoustic experience.

Another object is to provide bass audio system for adjusting the relative emphasis of the psychoacoustic elements of the bass signals to accurately emulate the bass performance of the sound being projected.

A further object of the present invention to enhance the performance of a bass driver by limiting the extremely low frequency (infrasound frequency range) displacement, and thus allow a relatively small loudspeaker driver to create the equivalent sound pressure level of a larger loudspeaker driver.

These and other objects of the invention are achieved an arrangement of analog or potentially digital networks that filter the signal at two different bass frequency levels. The outputs are adjusted in gain relative to each other and may optionally be phase inverted. The outputs of the filter networks are either summed electrically to drive a single voice coil speaker through a single channel power amplifier, or applied to separate inputs of a two channel amplifier to drive individual inputs of a dual voice coil speaker.

In an exemplary embodiment, a circuit is devised having dual channel inputs coupled to a pair of tandem filter networks using phase inverted signals to produce pairs of monophonic outputs of differing frequency range. These monophonic signals either are summed electrically and applied to a single channel electrical amplifier which supplies the single voice coil speaker, or are supplied to separate input channels of a power amplifier whose outputs are connected to individual voice coils of a dual voice coil speaker.

One lower frequency range is selected to provide the intensity and punch of the bass signal while a second, higher frequency range is supplied to permit overtones contributing t0 spatiality and directionality. The relative level of the signal in these respective ranges can be set or adjusted to emphasize one aspect or the other of the psychoacoustic experience and to otherwise blend the aspects of the sound to realistically produce the sound being emulated. For example, the present audio control system permits blending of the different aspects of the bass signal of a stand-up bass to produce the omnipresent, non-directional waves that are sensed, and in some instances felt, while also projecting a proper level of the higher frequency tones that identify to the observer the perceived location of the sound source.

Significantly, the audio control system of the invention also filters the bass signal such that infrasonic frequencies are attenuated so as to limit the non-perceptible aspects that can over drive the speaker. This low-end limitation permits increased performance in the audible range.

Thus, the present audio system controls blending of various psychoacoustic elements in the bass spectrum, while limiting inaudible signals to permit better performance in a smaller loudspeaker.

DETAILED DESCRIPTION OF THE INVENTION

Figure 1:
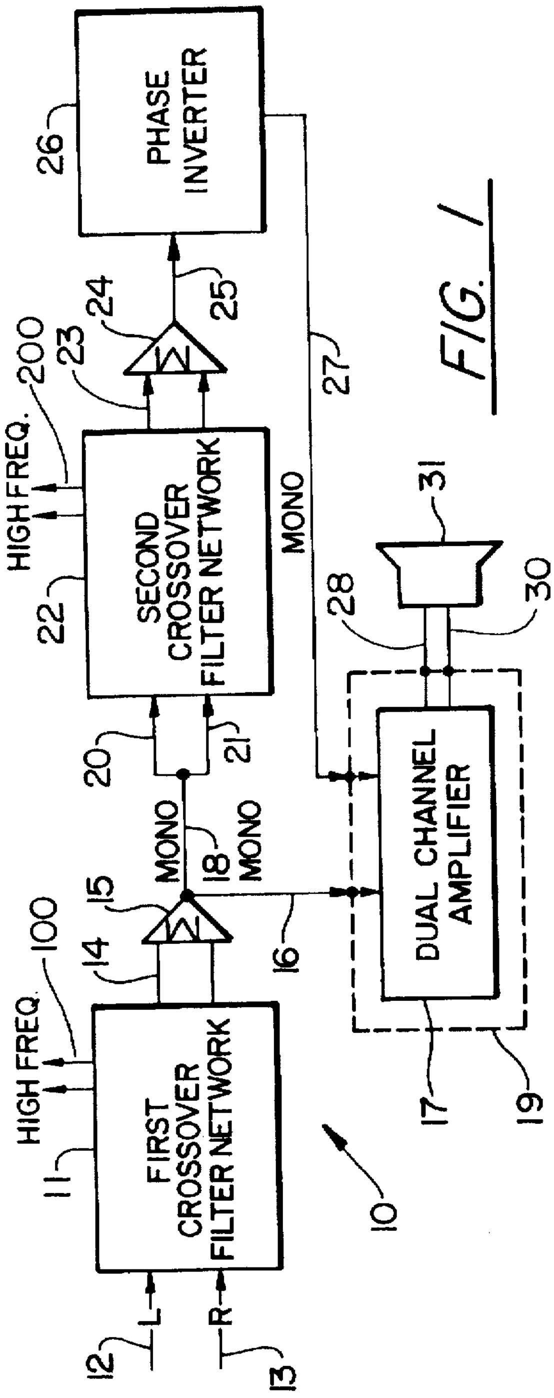
FIG. 1 is a block diagram of an audio bass frequency speaker circuit according to the present invention.
Figure 4:
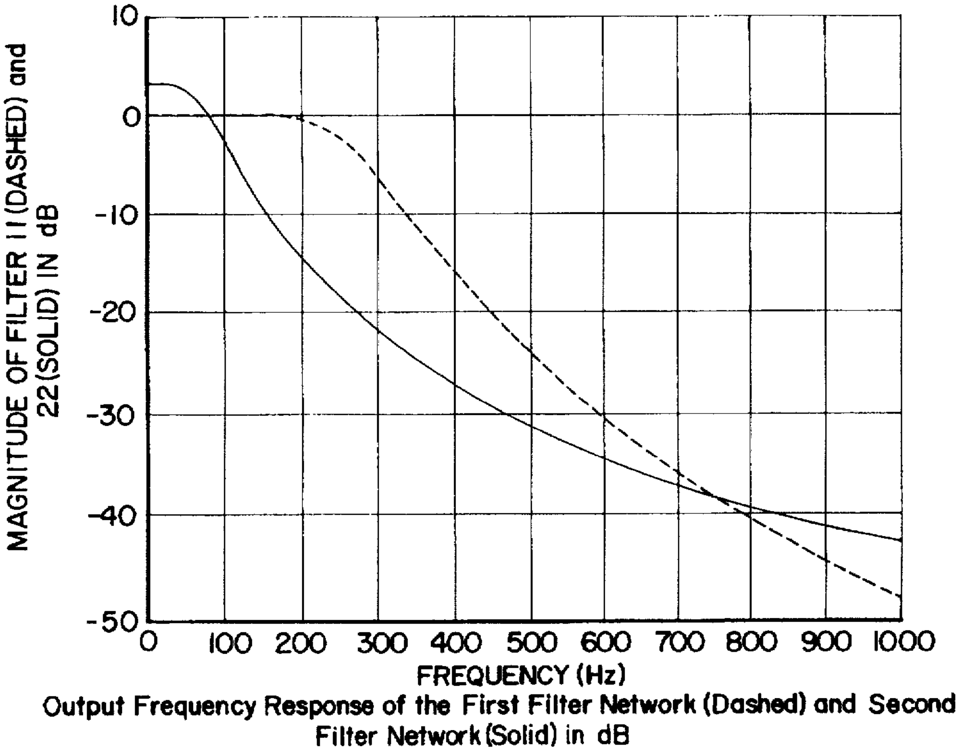
FIG. 4 is a graph of output frequency response of the two crossover filter circuits in FIG. 1.

Referring to FIG. 1 of the drawings, an audio bass speaker system 10 includes a first crossover filter network 11 having a left audio channel input 12 and a right audio channel input 13. The first crossover filter network (or circuit) 11 has a cutoff frequency between 200–600 Hz with a 6 to 24 dB per octave roll-off slope. In a preferred embodiment, the first crossover filter network 11 has a cutoff frequency of 250 Hz and a 24 dB per octave roll-off slope as depicted by a dotted line in the plot of signal magnitude versus frequency shown in FIG. 4, which is the response of the signal on line 16 when both the signals at both channel inputs 12 and 13 are equal, for example. Note that the cutoff frequency of 250 Hz is seen to have a –3 dB response. The other outputs 100 from the first crossover filter network 11 are high frequency outputs.

The output signals for the two audio channels of the first filter network 11 are produced on lines 14 and are fed to a first summing circuit 15 which could be incorporated into the filter network 11, if desired. The first summing circuit 15 combines the left and right filtered audio signals into a monophonic (MONO) signal which is fed via line 16 to an input for one channel of a dual channel audio amplifier 17 that is in an output stage 19.

The monophonic signal from the first summing circuit 15 also is fed through line 18 to both channel inputs 20 and 21 of a second crossover filter network 22. The second crossover filter network 22 has a cutoff frequency below that of the first crossover filter network 11 wherein the cutoff frequency is fixed at or selectable between one of three preferred contours. The first selection provides a cutoff frequency in the 50–180 Hz range with about a 12 dB per octave slope. This selection is depicted by the solid line in FIG. 4 in which the initial filter gain is 1.4 (3 dB), and the cutoff frequency is 70 Hz with a 3 dB signal reduction from the initial signal magnitude at 0 Hz and a roll-off of about 12 dB per decade. The second filter contour provides a cutoff frequency between 180–250 Hz with approximately 18 dB per octave slope and the third preferred selection provides a cutoff frequency between 250–400 Hz with approximately 24 dB per octave slope. Typically, the cutoff frequency will fall within the middle of these ranges and higher frequencies would slope off. Filtered output signals for each channel of the second crossover filter network are produced on a pair of lines 23 as two monophonic outputs having a roll off of between 6 dB and 24 dB per octave depending upon the order of the filter selected (every 6 dB per octave represents an additional pole).

The monophonic signals on the lines 23 are fed into a second summing circuit 24 which can be incorporated into the second crossover filter network 22. The second summing circuit 24 combines the signals on lines 23 into a monophonic low frequency signal on the line 25 which is fed into a phase inverter 26. The other outputs 200 from the second crossover filter network 22 are high frequency outputs. The phase inverter 26 inverts the phase of the monophonic signal from the second summing circuit which signal then is applied via line 27 to an input of another channel of the audio amplifier 17. Thus one input of the audio amplifier receives via line 16 a non-inverted monophonic audio signal having a higher frequency cutoff than the monophonic audio signal received from line 27 at another amplifier input. Alternatively separate single channel amplifiers can process signals from lines 16 and 27. The outputs 28 and 30 of the audio amplifier 17 are connected to separate inputs of a dual voice coil woofer 31 which serves to add the two signals by way of the induced magnetic fields. More than one bass driver, or woofer, may be used in speaker system 10.

Figure 2:
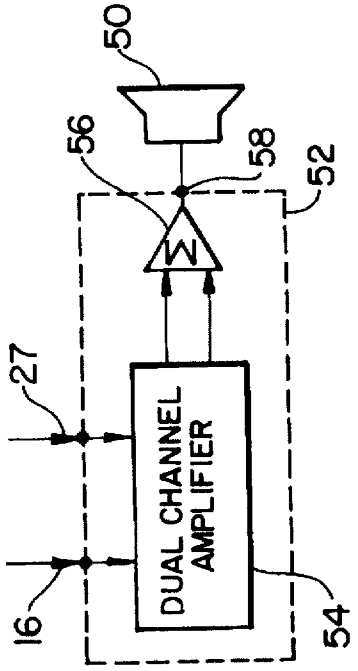
FIG. 2 is a block diagram of an alternative output stage for the audio bass frequency speaker circuit in FIG. 1.

As shown in FIG. 2, a single voice coil woofer 50 may be used by providing an alternative output stage 52 in which the output signals of a dual channel amplifier 54 are combined in a second summing circuit 56 to produce a monophonic signal at output 58 that is applied to the woofer.

Figure 3:
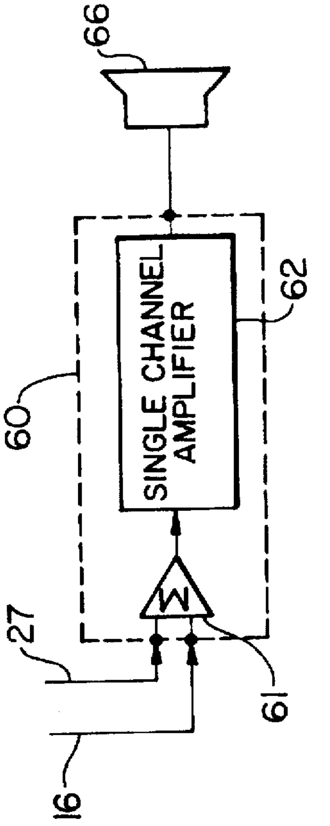
FIG. 3 is a block diagram of another alternative output stage for the audio bass frequency speaker circuit in FIG. 1.

Another alternative output stage 60 is illustrated in FIG. 3. In this output stage 60, the signals carried by lines 16 and 27 are be combined electrically in summing circuit 61 prior to a single channel amplifier 62 which drives a single voice coil woofer 66.

Figure 5:
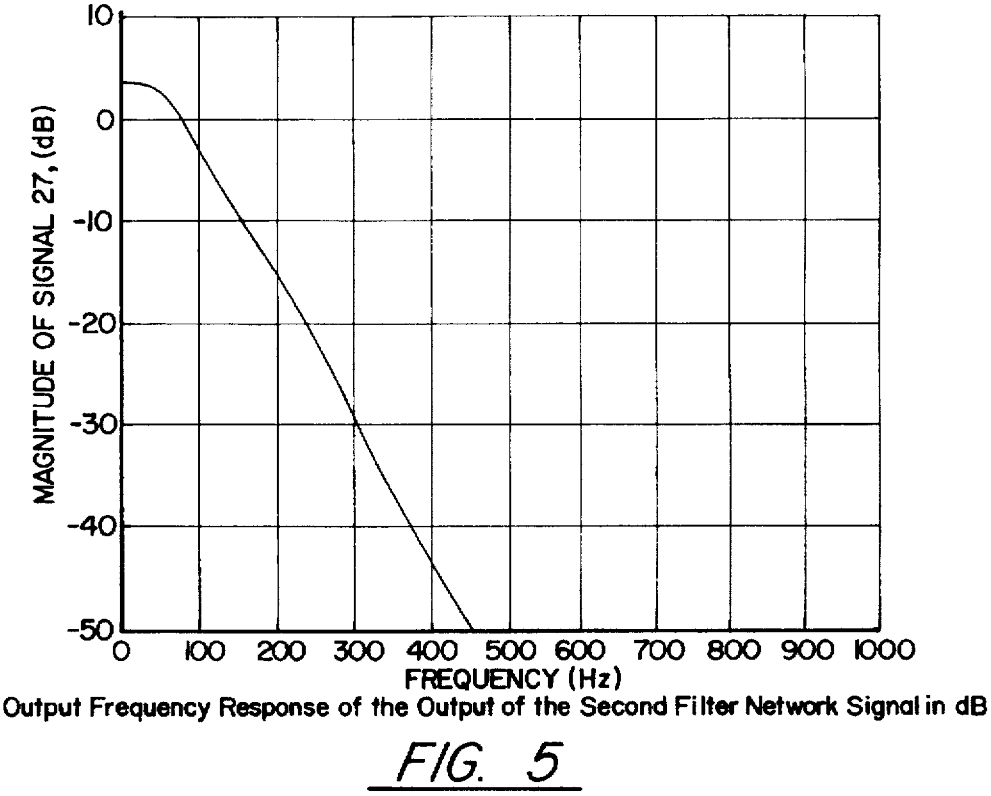
FIG. 5 is a graph of output frequency response of the second crossover filter signal 27.

Providing two audio signals with overlapping frequencies, wherein one has a wider frequency range and the other signal being inverted, allows the bass driver of speaker 31 to produce an output with limited low frequency response at or below the lower limit of the audible range and with improved response in the audible range. The magnitude response of the audio signal on filter output line 27 relative to inputs 12 and 13 of the system 10 is shown in FIG. 5 and has a 3 dB gain at 0 Hz with an overall roll-off of 36 dB per octave.

Figure 6:
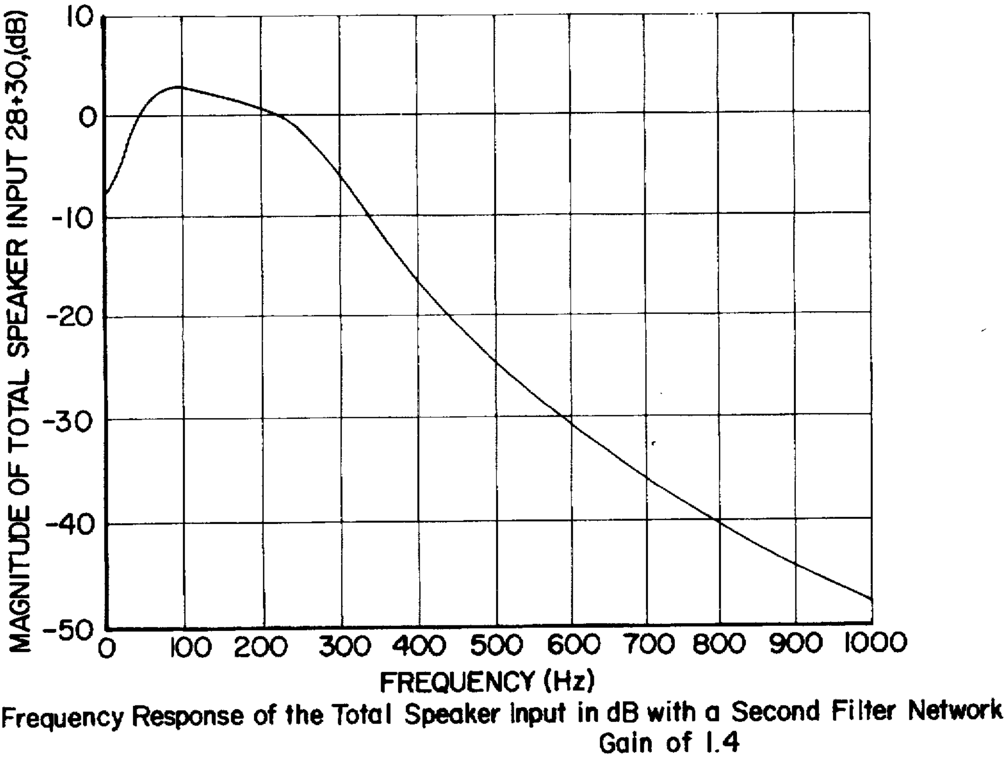
FIG. 6 is a graph of frequency response of the total speaker input when the second crossover filter network has a gain of 1.4.
Figure 7:
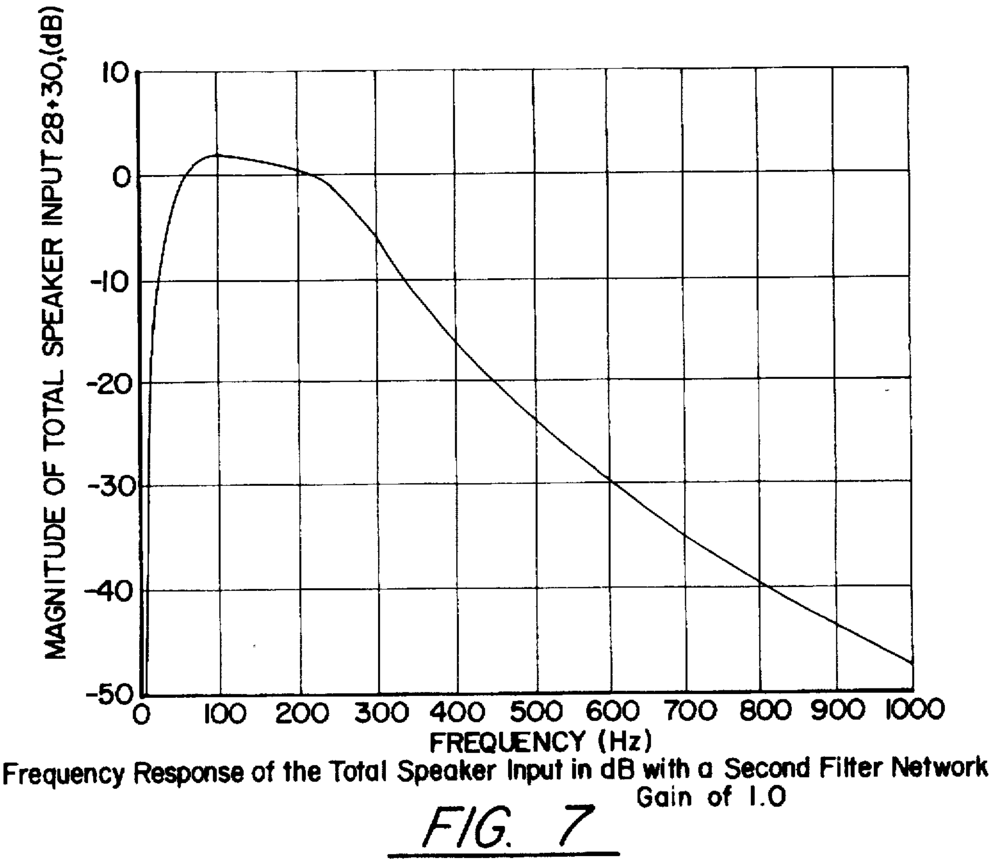
FIG. 7 is a graph of frequency response of the total speaker input when the second crossover filter network has a gain of 1.0.

A plot of the magnitude of the sum of signal 16 and 27 versus frequency is shown in FIG. 6 to demonstrate the effectiveness of this system. The response of the speaker system at 0 Hz is attenuated by means of the audio bass frequency circuit by an amount of 7.7 dB, and all frequencies below the threshold of hearing are attenuated by at least 4 dB. The speaker system 10 also increases the response in the region of 40 Hz to 220 Hz with a maximum response at about 80 Hz (+3.1 dB). The effect of this system on the overall performance of the bass driver is to limit the large displacements found in the infrasound frequency range, and improve the response above 40 Hz. This will allow a relatively small woofer driver of approximately 8 inch diameter to produce comparable overall sound pressure levels in the audible frequency range equivalent of a large 18 inch driver without excess distortion due to large displacements in the infrasound frequency range. The low frequency roll-off produced by the audio bass frequency circuit can be drastically effected by changes in cutoff frequencies or gains of filters 11 and 22. For example, compare the results of changing the gain of filter 22 of the previous example to a gain of 1 shown in FIG. 7 with that shown previously in FIG. 6. Note the significant attenuation of response in the infrasound region with very little effect in the audible range.

To further understand the advantages of the tandem filter arrangement, a simple example of the system will be modeled in the Laplace domain. A transfer function of the first filter network 11 (for example, a two-pole low-pass filter) can be modeled in the Laplace domain as follows:

$$\frac{OUT1(s)}{IN1(s)} = \frac{N_{11}}{(s-p_1^{11})(s-p_2^{11})} \tag{3}$$

where OUT1(s) is the Laplace transform of the output signal at lines 14, IN1(s) is the Laplace transform of the input signal at line 12, $P_1^{11}$ is the location of the first pole of the filter network 11, and $p_2^{11}$ is the location of the second pole. Similarly the transfer function for the second crossover filter network 22 can be modeled in the Laplace domain as follows:

$$\frac{OUT2(s)}{IN2(s)} = \frac{N_{22}}{(s-p_1^{22})(s-p_2^{22})} \tag{4}$$

where OUT2(s) is the Laplace transform of the output signal at lines 23, IN2(s) is the Laplace transform of the input signal at line 20, $p_1^{22}$ is the location of the first pole of the second crossover filter network 22, and $p_2^{22}$ is the location of the network's second pole. Using algebraic manipulations and basic control theory, the net transfer function for the speaker output, y, can be written in terms of an input 12 as follows:

$$\frac{y(s)}{IN(s)} = \frac{N_{11}}{(s-p_1^{11})(s-p_2^{11})} - \frac{N_{22}N_{11}}{(s-p_1^{11})(s-p_2^{11})(s-p_1^{22})(s-p_2^{22})} \tag{5}$$

After some algebraic manipulation, the following relation is produced:

$$\frac{y(s)}{IN(s)} = \frac{N_{11}(s-p_1^{22})(s-p_2^{22}) - N_{22}N_{11}}{(s-p_1^{11})(s-p_2^{11})(s-p_1^{22})(s-p_2^{22})} \tag{6}$$

The zeros of the numerator polynomial form the zeros of the composite audio bass filter system. These zeros are a strong function of the components (i.e. $N_{11}$, $p_1^{11}$) of each individual subsystem. The movement of the cutoff frequency through the movement of $p_1^{11}$ for example, or the change in gain of a particular section $N_{11}$ for example can be used to tune the locations of the zeros of the system quickly and accurately to meet the needs of the audio environment. In the previous example shown in FIG. 6, the values for the pole locations caused a zero to be placed at zero frequency which accounts for the extremely low response in the infrasound region (theoretically zero output at zero Hz). The two tandem filters thus can be tuned to suit the particular needs of the speaker system, as well as the rest of the acoustic environment (e.g., a room or the interior cabin of an automobile).

Figure 8:
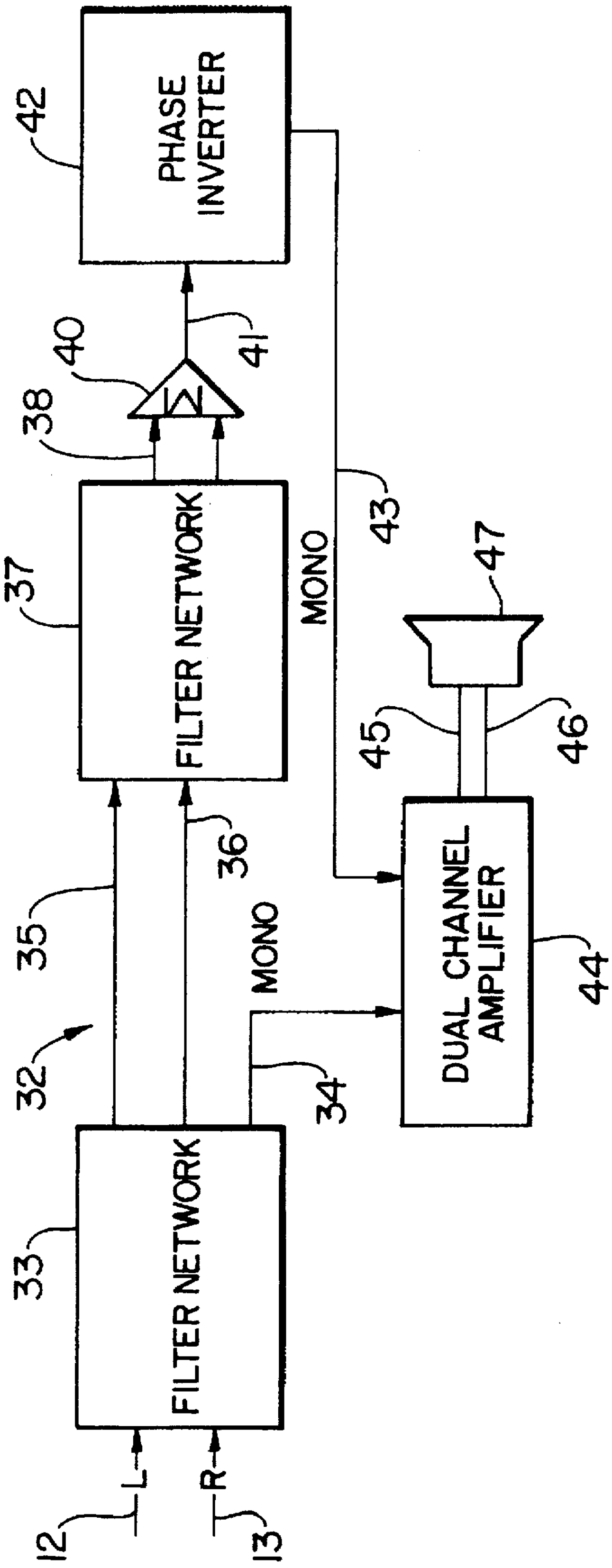
FIG. 8 is a block diagram of another embodiment of an audio bass frequency speaker circuit according to the present invention.

With reference to FIG. 8, an alternative embodiment of a bass speaker system 32 has an initial filter network 33 with a left channel input 12 and a right channel input 13. Filter network 33 produces a summed monophonic output on line 34 which has a cutoff frequency of between 60–80 Hz with a 6 to 24 dB per octave rolloff, and produces a pair of full range (i.e. non-attenuated), left and right channel audio signals on lines 35 and 36, which are connected in parallel to another filter network 37.

The other filter network 37 is keyed to pass only the low frequency signals and has the same selectable filter parameters as the second filter network 22 in FIG. 1 and thus produces similar output signals on a pair of lines 38. However, the signals on lines 38 are combined into a monophonic signal on line 41 by summing circuit 40 which then is fed into a phase inverter circuit 42. The phase inverter circuit 42 produces a phase inverted monophonic signal in line 43 which substantially only has frequencies below 400 Hz with the precise cutoff depending on the parameters selected for the second filter 37.

The phase inverted monophonic signal 43 is fed to one channel of an amplifier 44, which has another channel that receives the non-inverted monophonic signal on line 34 from the initial filter network 33, which signal has a cutoff frequency between 60 and 80 Hz. The two signals are amplified and fed via two monophonic output lines 45 and 46 to an electrodynamic long-throw woofer 47, which can be either a single or a dual voice coil woofer.

Thus, both speaker systems 10 and 32 of FIGS. 1 and 8 provide two monophonic audio input signals to separate channels of an amplifier, wherein each signal has a different low frequency range and one signal is phase inverted relative to the other. In an alternative embodiment, the output of the two filters can be summed in analog, fed to a single channel power amplifier and sent to a single voice coil woofer.

The present invention provides a bass driver circuit which limits the speaker cone displacement in the infrasound region. That circuit has been found to improve bass response in any woofer type, such as a closed box, infinite baffle, tuned port, full horn, or isobaric. However, the present invention is not to be construed as limited to the forms shown which are to be considered illustrative rather than restrictive.

What is claimed is:

1. An audio loudspeaker driver circuit for bass frequencies, said circuit comprising:

a first filter network having a first input for receiving a first audio signal, and having a first output at which a first output signal is produced, wherein said first filter network produces the first output signal by attenuating frequencies in the first input signal that are above a first cutoff frequency;

a second filter network having a second input for receiving a second audio signal, and having a second output at which a second output signal is produced, wherein said second filter network produces the second output signal by attenuating frequencies in the second input signal that are above a second cutoff frequency which is lower than the first cutoff frequency;

an audio output stage having a first input terminal coupled to the first output of said first filter network, a second input terminal, and an output terminal for connection to a loudspeaker, said audio output stage including an amplifier coupled between the first and second input terminals and the output terminal; and a signal phase inverter connected in series with said second filter between the first output of first filter network and the second input terminal of said audio output stage.

2. The audio loudspeaker driver circuit according to claim 1, wherein said audio output stage comprises a signal combiner having an input connected to the first input terminal and having another input connected to the second input terminal, said signal combiner having an output connected to an input of the amplifier.

3. The audio loudspeaker driver circuit according to claim 1, wherein the amplifier of said audio output stage is a dual channel amplifier with one channel input connected to the first input terminal and a second channel input connected to the second input terminal, and further having first and second channel outputs.

4. The audio loudspeaker driver circuit according to claim 3, further comprising a dual coil loudspeaker having one coil coupled to the first channel output and another coil coupled to the second channel output.

5. The audio loudspeaker driver circuit according to claim 3, wherein said audio output stage further comprises a signal combiner having an input connected to the first channel output and another input connected to the second channel output, said signal combiner having an output connected to the output terminal.

6. The audio loudspeaker driver circuit according to claim 5, further comprising a single coil loudspeaker coupled to the output terminal of said audio output stage.

7. The audio loudspeaker driver circuit according to claim 1, wherein the first cutoff frequency is between 200 Hz and 600 Hz.

8. The audio loudspeaker driver circuit according to claim 1, wherein the first cutoff frequency is between 200 Hz and 600 Hz, and the first filter network has a rolloff of substantially 12 db per octave.

9. The audio loudspeaker driver circuit according to claim 1, wherein the second cutoff frequency is between 50 Hz and 400 Hz.

10. The audio loudspeaker driver circuit according to claim 1, wherein the second cutoff frequency is between 50 Hz and 180 Hz and the second filter network has a rolloff of substantially 12 db per octave.

11. The audio loudspeaker driver circuit according to claim 1, wherein the second cutoff frequency is between 180 Hz and 250 Hz and the second filter network has a rolloff of substantially 18 db per octave.

12. The audio loudspeaker driver circuit according to claim 1, wherein the second cutoff frequency is between 250 Hz and 400 Hz and the second filter network has a rolloff of substantially 24 db per octave.

13. An audio loudspeaker driver circuit for a bass frequency range, said circuit comprising:

a first filter network having a first pair of inputs for receiving a pair of audio signals, and having a first pair of outputs, wherein said first filter network attenuates frequencies in the pair of audio signals that are above a first cutoff frequency to produce a pair of filtered signals at the first pair of outputs;

a first summing circuit having inputs connected to the first pair of outputs, and having an output at which a monophonic signal is produced by combining the pair of filtered signals;

a second filter network connected to the output of the summing circuit and having an output, wherein said second filter network attenuates frequencies in a signal received from said first summing circuit that are above a second cutoff frequency which is lower than the first cutoff frequency and produces a filtered signal at the output of the second filter network;

a signal phase inverter connected to the output of second filter network and having an output; and an audio output stage having a first input terminal coupled to the output of said summing circuit, a second input terminal connected to the output of said signal phase inverter, and an output terminal for connection to a loudspeaker, said audio output stage including an amplifier coupled between the first and second input terminals and the output terminal.

14. The audio loudspeaker driver circuit according to claim 13, wherein said audio output stage comprises a second summing circuit having an input connected to the first input terminal and having another input connected to the second input terminal, said second summing circuit having an output connected to an input of the amplifier.

15. The audio loudspeaker driver circuit according to claim 13, wherein the amplifier of said audio output stage is a dual channel amplifier with one channel input connected to the first input terminal and a second channel input connected to the second input terminal, and further having first and second channel outputs.

16. The audio loudspeaker driver circuit according to claim 15, further comprising a dual coil loudspeaker having one coil coupled to the first channel output and another coil coupled to the second channel output.

17. The audio loudspeaker driver circuit according to claim 15, wherein said audio output stage further comprises a second summing circuit having an input connected to the first channel output and another input connected to the second channel output, said second summing circuit having an output connected to the output terminal.

18. The audio loudspeaker driver circuit according to claim 13, wherein the first cutoff frequency is between 200 Hz and 600 Hz.

19. The audio loudspeaker driver circuit according to claim 13, wherein the second cutoff frequency is between 50 Hz and 400 Hz.

20. The audio loudspeaker driver circuit according to claim 13, wherein characteristics of said second filter network are selected from the group consisting of a second cutoff frequency between 50 Hz and 180 Hz and a rolloff of substantially 12 db per octave, a second cutoff frequency between 180 Hz and 250 Hz and a rolloff of substantially 18 db per octave, and a second cutoff frequency between 250 Hz and 400 Hz and a rolloff of substantially 24 db per octave.

21. An audio loudspeaker driver circuit for a bass frequency range, said circuit comprising:

a first filter network having an output and a first pair of inputs for receiving a pair of audio signals, wherein said first network produces a monophonic signal at the output which monophonic signal is a combination of frequencies in the pair of audio signals that are below a first cutoff frequency;

a second filter network having two outputs and a first pair of inputs for receiving the pair of audio signals, wherein said second filter network attenuates frequencies in the pair of audio signals that are above a second cutoff frequency which is higher than the first cutoff frequency and produces a pair of filtered signals at the two outputs;

a first summing circuit having inputs connected to the two outputs of said second filter network and having an output at which a monophonic signal is produced by a combination of signals from said second filter network;

a signal phase inverter connected to invert a signal at the output of first summing circuit, and having an output; and an audio output stage having a first input terminal coupled to the output of said first filter network, a second input terminal connected to the output of said signal phase inverter and an output terminal for connection to a loudspeaker, said audio output stage including an amplifier coupled between the first and second input terminals and the output terminal.

22. The audio loudspeaker driver circuit according to claim 21, wherein the first cutoff frequency is between 60 Hz and 80 Hz, and the first filter network has a rolloff of substantially 6 to 24 db per octave.

23. The audio loudspeaker driver circuit according to claim 21, wherein the second cutoff frequency is between 50 Hz and 400 Hz.

24. The audio loudspeaker driver circuit according to claim 21, wherein characteristics of said second filter network are selected from the group consisting of a second cutoff frequency between 50 Hz and 180 Hz and a rolloff of substantially 12 db per octave, a second cutoff frequency between 180 Hz and 250 Hz and rolloff of substantially 18 db per octave, and a second cutoff frequency between 250 Hz and 400 Hz and a rolloff of substantially 24 db per octave.

* * * * *